United States Patent
Pi et al.

(10) Patent No.: US 9,236,105 B2
(45) Date of Patent: Jan. 12, 2016

(54) MAGNETIC MEMORY DEVICES AND METHODS OF WRITING DATA TO THE SAME

(71) Applicants: Ung-hwan Pi, Seoul (KR); Kwang-seok Kim, Seoul (KR); Kee-won Kim, Suwon-si (KR); Sung-chul Lee, Osan-si (KR); Young-man Jang, Hwaseong-si (KR)

(72) Inventors: Ung-hwan Pi, Seoul (KR); Kwang-seok Kim, Seoul (KR); Kee-won Kim, Suwon-si (KR); Sung-chul Lee, Osan-si (KR); Young-man Jang, Hwaseong-si (KR)

(73) Assignee: Samsung Electornics Co., Ltd., Gyeonggi-do (KR)

( * ) Notice: Subject to any disclaimer, the term of this patent is extended or adjusted under 35 U.S.C. 154(b) by 53 days.

(21) Appl. No.: 14/184,043

(22) Filed: Feb. 19, 2014

(65) Prior Publication Data

US 2014/0269036 A1    Sep. 18, 2014

(30) Foreign Application Priority Data

Mar. 15, 2013   (KR) .................. 10-2013-0028240

(51) Int. Cl.
| G11C 11/00 | (2006.01) |
| G11C 11/16 | (2006.01) |
| G11C 11/18 | (2006.01) |

(52) U.S. Cl.
CPC ............ *G11C 11/1675* (2013.01); *G11C 11/16* (2013.01); *G11C 11/18* (2013.01)

(58) Field of Classification Search
CPC ................................ G11C 11/16; G11C 11/18
USPC .................................. 365/148, 158, 171, 173
See application file for complete search history.

(56) References Cited

U.S. PATENT DOCUMENTS

| 8,980,650 B2 * | 3/2015 | Oguz et al. .................... 438/3 |
| 2009/0161265 A1 | 6/2009 | Sugano et al. |
| 2010/0097063 A1 * | 4/2010 | Ando et al. .................. 324/316 |
| 2011/0084349 A1 | 4/2011 | Uchida et al. |
| 2012/0129008 A1 | 5/2012 | Fukuzawa et al. |
| 2014/0084398 A1 * | 3/2014 | Oguz et al. .................. 257/421 |
| 2014/0169088 A1 * | 6/2014 | Buhrman et al. ............. 365/158 |
| 2014/0269035 A1 * | 9/2014 | Manipatruni et al. ........ 365/158 |

FOREIGN PATENT DOCUMENTS

| JP | 2006-059869 A | 3/2006 |
| JP | 2006-352062 A | 12/2006 |
| KR | 2010-0119196 A | 11/2010 |
| KR | 2012-0048482 A | 5/2012 |
| KR | 2012-0080532 A | 7/2012 |

* cited by examiner

*Primary Examiner* — Gene Auduong
(74) *Attorney, Agent, or Firm* — Harness, Dickey & Pierce, P.L.C.

(57) ABSTRACT

Magnetic memory devices include a magnetoresistive cell including a free layer having a variable magnetization direction and a pinned layer having a fixed magnetization direction, a bit line on the magnetoresistive cell and including a spin Hall effect material layer exhibiting a spin Hall effect and contacting the free layer; and a lower electrode under the magnetoresistive cell. A voltage is applied between the bit line and the lower electrode so that current passes through the magnetoresistive cell.

24 Claims, 5 Drawing Sheets

MAGNETIC MEMORY DEVICES AND METHODS OF WRITING DATA TO THE SAME

CROSS-REFERENCE TO RELATED APPLICATIONS

This application claims the benefit of priority under 35 U.S.C. §119 from Korean Patent Application No. 10-2013-0028240, filed on Mar. 15, 2013, in the Korean Intellectual Property Office, the disclosure of which is incorporated herein by reference in its entirety.

BACKGROUND

1. Field

Example embodiments relate to magnetic memory devices and/or methods of writing data to the magnetic memory devices.

2. Description of the Related Art

A magnetic random access memory (MRAM) is a memory device that stores information by using a change in resistance of a magnetic tunneling junction (MTJ) element. The resistance of the MTJ varies depending on a magnetization direction of a free layer. When the magnetization direction in the free layer is the same as that of a pinned layer, the MTJ element has a low resistance value. Conversely, when the magnetization direction of the free layer is opposite to that of the pinned layer, the MTJ element has a high resistance value. A low resistance state and a high low resistance state of the MTJ element correspond to data '0' and '1', respectively. Due to its non-volatility, high speed, and high endurance, the MRAM has emerged as one of the most promising next-generation non-volatile memory devices.

Early stage magnetic memory devices employ Oersted fields to switch a MTJ device, and create an Oersted field by using a conducting wire in which current flows. For example, a magnetic field generated by current flowing through a bit line and a word line is used to switch the magnetization direction of a free layer. Furthermore, a switching method called toggle switching may significantly reduce writing errors. Toggle switching refers to a process in which current is applied to a bit line and a word line with a time delay therebetween according to a predetermined (or, set) order. In this process, to reverse the magnetization direction of the free layer, the order in which current is applied to two conducting wires may be reversed instead of changing the direction of current.

However, when the size of a unit cell is reduced to implement a high density memory device, a switching field increases with an increase of the coercivity of a free layer, thereby resulting in an increase in amplitude of applied current. Furthermore, in a memory cell array having a plurality of memory cells, switching may occur even in a free layer in an inappropriate cell. Thus, a magnetic memory device employing switching induced by Oersted fields may have difficulty in achieving selectivity and high density.

To overcome the above problems, a spin transfer torque magnetic random access memory (STT-MRAM) which switches the magnetization direction of a memory cell by using a current-induced STT is receiving much attention as a next-generation high density memory device. However, STT-MRAM does not allow toggle switching, and providing a margin for reducing writing errors becomes a key issue for the STT-MRAM.

SUMMARY

Provided are magnetic memory devices configured to switch magnetoresistive cells using a spin Hall effect and methods of writing data to the magnetic memory devices.

According to example embodiments, a magnetic memory device includes a magnetoresistive cell including a free layer and a pinned layer, wherein the free layer has a variable magnetization direction, and the pinned layer has a fixed magnetization direction. The magnetic memory device further includes a bit line on the magnetoresistive cell, wherein the bit line includes a spin Hall effect material layer exhibiting a spin Hall effect, and the spin Hall effect material contacts the free layer. The magnetic memory device includes a lower electrode below the magnetoresistive cell, wherein the lower electrode is configured to allow a current to pass through the magnetoresistive cell based on a voltage applied between the bit line and the lower electrode.

During writing of data, the bit line may be configured to allow a first current to flow along a first direction parallel to the free layer, and the lower electrode may be configured to allow a second current to pass through the magnetoresistive cell based on the applied voltage.

The free layer may have in-plane magnetic anisotropy and may have an easy axis tilted at 45 degrees relative to the first direction.

The first current and the second current may be applied at different start times.

The direction of the first and second currents may remain the same and may maintain a unipolar direction when changing the variable magnetization direction of the free layer.

The spin Hall effect material layer may include at least one selected from platinum (Pt), tantalum (Ta), and tungsten (W).

The spin Hall effect material layer may have a thickness greater than a spin diffusion length of a material of the spin Hall effect material layer.

The bit line may further include an electrode material layer on the spin Hall effect material layer. The electrode material layer may be made of a material having a resistivity less than a resistivity of the spin Hall effect material layer.

The free layer may have perpendicular magnetic anisotropy.

The magnetoresistive cell may be a magnetic tunneling junction (MTJ) cell.

The magnetoresistive cell may include a pinning layer made of an antiferromagnetic material, the pinned layer on the pinning layer, a non-magnetic layer on the pinned layer, and the free layer on the non-magnetic layer.

The pinned layer may include first and second pinned layers, and a spacer layer between the first and second pinned layers. The first and second pinned layers may each be made of a magnetic material and may have a fixed magnetization direction. The first pinned layer, the spacer layer, and the second pinned layer may collectively form a synthetic anti-ferromagnetic (SAF) structure.

The free layer may include first and second free layers, and a spacer layer between the first and second free layers. The first and second pinned layers may each be made of a magnetic material and may have a variable magnetization direction. The first free layer, the spacer layer, and the second free layer may collectively form a free-SAF structure.

The magnetic memory device may further include a switching device configured to turn on and turn off a flow of the current passing through the magnetoresistive cell.

The switching device may include a transistor, a source electrode and a drain electrode. The source electrode or the drain electrode of the transistor may be the lower electrode.

According to example embodiments, a method of writing data to a magnetic tunneling junction (MTJ) cell including a free layer having a variable magnetization direction and a pinned layer having a fixed magnetization direction includes applying a first current to a bit line contacting the free layer, wherein the first current flows along a direction parallel to the free layer and creates a spin current due to a spin Hall effect. The method further includes applying a second current to the free layer, wherein the second current creates a spin transfer torque which transfers the fixed magnetization direction of the pinned layer to the free layer and passes through the magnetoresistive cell. The applying of the first current and the applying of the second current start with a time delay therebetween, proceed simultaneously during a set time interval, and end with a time delay therebetween.

The variable magnetization direction of the free layer may have a first direction and a second direction rotated at 180 degrees from the first direction. The direction of the first current and a direction the second current may remain the same while reversing the variable magnetization from the first direction to the second direction and from the second direction to the first direction.

The applying of the first current and the applying of the second current when the variable magnetization direction may be reversed from the first direction to the second direction proceed with the time delay therebetween. The time delay may have a reverse order when the variable magnetization direction is reversed from the second direction to the first direction.

The bit line may include a spin Hall effect material layer exhibiting a spin Hall effect and contacting the free layer.

The bit line may further include an electrode material layer on the spin Hall effect material layer. The electrode material layer may be made of a material having a resistivity less than a resistivity of the spin Hall effect material layer.

According to example embodiments, a method of writing data to a magnetic tunneling junction (MTJ) cell including a free layer and a pinned layer includes applying a first current to a conductive layer contacting the free layer, and applying a second current that passes through the pinned layer to the free layer. The applying of the first current includes creating a spin current in a direction substantially orthogonal to the first current based a spin Hall effect induced by a spin Hall effect material in the conductive layer. The applying of the second layer includes creating a spin torque which transfers a fixed magnetic direction of the pinned layer to the free layer. The first current and the second current maintain a unipolar direction when changing a variable magnetization direction of the free layer.

The applying of the first current and the applying of the second current may be started at different times.

The first current may be applied in a direction substantially parallel to the free layer.

The free layer and the pinned layer may have in-plane magnetic anisotropy, and the applying of the first current may be performed such that an easy axis of the free layer tilts at an angle orthogonal to a direction in which the first current is applied.

The applying of the second current may include passing the second current through either a synthetic antiferromagnetic (SAF) structure in the pinned layer or a free-SAF structure in the free layer.

The free layer and the pinned layer may have perpendicular magnetic anisotropy, and the applying of the first current may be performed such that an easy axis of the free layer tilts at an angle orthogonal to a direction in which the first current is applied.

BRIEF DESCRIPTION OF THE DRAWINGS

Example embodiments will be more clearly understood from the following detailed description taken in conjunction with the accompanying drawings. FIGS. 1-8 represent non-limiting, example embodiments as described herein.

FIG. 1 is a schematic cross-sectional view of a magnetic memory device according to example embodiments;

FIG. 3 is a graph illustrating a method of applying current when data is written to a magnetic memory device according to example embodiments;

FIG. 5 illustrates an exemplary structure of a magnetoresistive cell for use in the magnetic memory device of FIG. 1;

FIG. 6 illustrates another exemplary structure of a magnetoresistive cell for use in the magnetic memory device of FIG. 1;

FIG. 7 illustrates another exemplary structure of a magnetoresistive cell for use in the magnetic memory device of FIG. 1; and FIG. 8 is a schematic cross-sectional view of a magnetic memory device according to other example embodiments.

DETAILED DESCRIPTION

Figure 1:
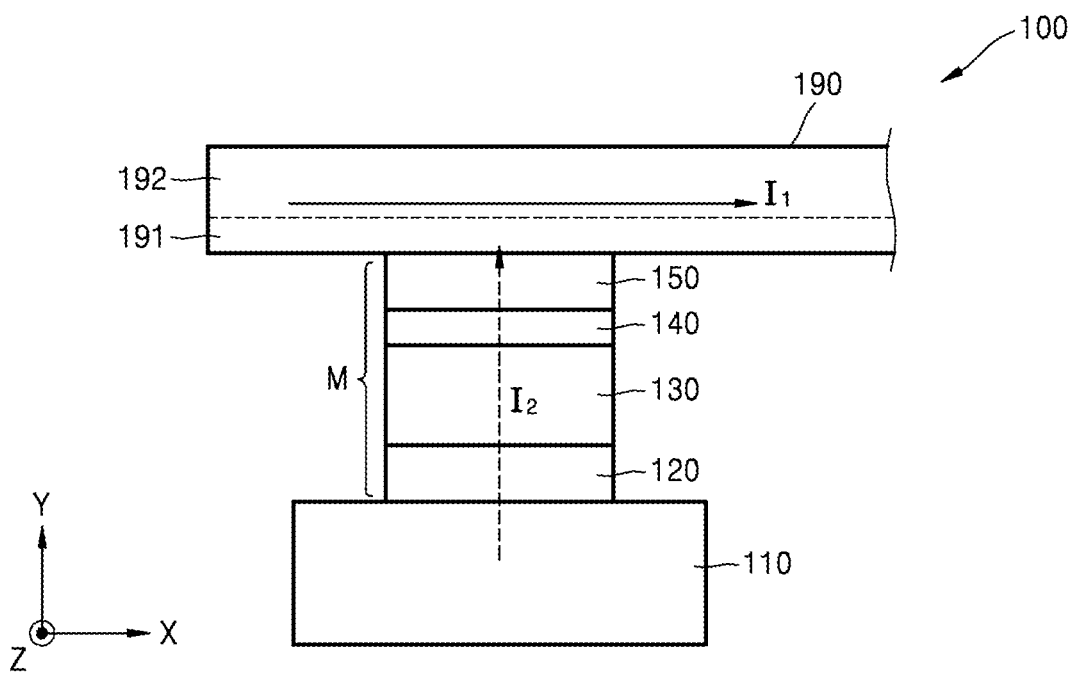

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

FIG. 1 is a schematic cross-sectional view of a magnetic memory device according to example embodiments.

Referring to FIG. 1, a magnetic memory device 100 includes a magnetoresistive cell M, which is a magnetic tunneling junction (MTJ) cell, including a free layer 150 having a variable magnetization direction and a pinned layer 130 having a fixed magnetization direction, a bit line 190 including a spin Hall effect material layer 191, which exhibits a spin Hall effect, and disposed on the magnetoresistive cell M so that the spin Hall effect material layer 191 contacts the free layer 150, and a lower electrode 110 disposed below (or, under) the magnetoresistive cell M to apply a voltage between the bit line 191 and the lower electrode 110 itself so that current passes through the magnetoresistive cell M. In example embodiments, the voltage may be applied between the bit line 191 and the lower electrode 110 by a controller (not shown) configured to control the voltage. In example embodiments, the current passes through the lower electrode 110 to the magnetoresistive cell M based on the applied voltage. The controller may be connected to a switching device (described below).

During data writing, the magnetic memory device 100 magnetizes the free layer 150 by employing a spin Hall effect induced by a first current I1 flowing in the bit line 190, and a spin transfer torque induced by a second current I2 passing through the magnetoresistive cell M. In this case, the magnetic memory device 100 uses a toggle switching mode which adjusts the start timing, end timing, and the order of application of current without changing the direction of the first and second currents I1 and I2. More specifically, during writing, the first current I1 flowing along a first direction parallel to the free layer 150 and the second current I2 passing through the magnetoresistive cell M along a second direction perpendicular to the first direction are applied to the bit line 190. The first and second currents I1 and I2 may be only turned on and off at predetermined (or, set) timing while maintaining a unipolar direction without changing their directions.

The configuration and materials of the magnetic memory device 100 will now be described in detail.

The bit line 190 includes the spin Hall effect material layer 191 contacting the free layer 150, and an electrode material layer 192 formed on the spin Hall effect material layer 191.

The spin Hall effect generates a spin current in a direction perpendicular to the flow of current. This effect occurs because each electron in a flow of current has a spin angular momentum. Hereinafter, the spin angular momentum is briefly abbreviated as 'spin'. Electrons may have two spin states, spin-up and spin-down, and may have a momentum in a direction corresponding to a product of vectors in the direction in which the electrons move and in the spin direction. For example, if the current flows in an x direction, an electron has spin up in the +z direction and spin down in the −z direction, a spin-up electron is deflected in the −y direction which is a direction of product of vectors in the −x and +z directions while a spin-down electron is deflected in the +y direction which is a direction of product of vectors in the −x and −z directions. Thus, a spin current is created in a direction orthogonal to the current flow. This phenomenon is called a spin Hall effect because it is similar to a Hall effect. The Hall effect refers to an electric potential difference arising across both ends of a conducting wire, which carries current and is placed in an external magnetic field, in a direction perpendicular to the current flow due to the Lorentz force produced by the magnetic field.

A spin Hall effect does not often occur in a non-magnetic material having almost equal numbers of spin up electrons and spin down electrons. The spin Hall effect material layer 191 is made of a material inducing a large spin Hall effect, having a large difference between the numbers of spin up and down electrons, or exhibiting large spin orbit coupling. For example, the spin Hall effect material layer 191 may be formed of platinum (Pt), tantalum (Ta), or tungsten (W).

The spin Hall effect material layer 191 may have a thickness of about 10 nm, which is greater than a spin diffusion length of a material of the spin Hall effect material layer 191.

The electrode material layer 192 on the spin Hall effect material layer 191 may be made of a material having a resistivity that is less than that of the spin Hall effect material layer 191. For example, the electrode material layer 192 may be made of aluminum (Al) or copper (Cu).

The free layer 150 is a magnetic layer having a variable magnetization direction, and may be formed of a ferromagnetic material containing at least one of cobalt (Co), iron (Fe), and nickel (Ni). For example, the ferromagnetic material may be cobalt iron boron (CoFeB) or nickel iron (NiFe). The ferromagnetic material may further include another element such as B, chromium (Cr), Pt, or palladium (Pd), but it is not limited thereto. The free layer 150 may have in-plane or perpendicular magnetic anisotropy.

A non-magnetic layer 140 may be realized as an insulating or conductive layer. For example, when the non-magnetic layer 140 is an insulating layer, the non-magnetic layer 140 may include an oxide such as magnesium oxide (MgO) or aluminum oxide ($AlO_x$). In this case, the magnetoresistive cell M may be an MTJ cell, and the non-magnetic layer 140 may be a tunnel barrier layer. Alternatively, when the non-magnetic layer 140 is a conductive layer, it may include at least one of Cu, Al, gold (Au), silver (Ag), and a mixture thereof.

The pinned layer 130 may be a magnetic layer having a fixed magnetization direction, and may be formed of a ferromagnetic material containing at least one of Co, Fe, and Ni. For example, the ferromagnetic material may be CoFeB or NiFe. The ferromagnetic material may further include another element such as B, Cr, Pt, or Pd, but is not limited thereto. The pinned layer 130 may have in-plane or perpendicular magnetic anisotropy.

A pinning layer 120 may be an antiferromagnetic layer having an in-plane or perpendicular magnetization direction. For example, the pinning layer 120 may include platinum manganese (PtMn).

Although not shown in FIG. 1, a buffer layer may be formed below the pinning layer 120. The buffer layer may include Ta or ruthenium (Ru).

The free layer 150 and the pinned layer 130 may have the same magnetic anisotropy. That is, if the free layer 150 has in-plane magnetic anisotropy, the pinned layer 130 may be made of a material having in-plane magnetic anisotropy. If the free layer 150 has perpendicular magnetic anisotropy, the pinned layer 130 may also be made of a material having perpendicular magnetic anisotropy.

When the free layer 150 has in-plane magnetic anisotropy, an easy axis of the free layer 150 is tilted at a predetermined (or, set) angle relative to the direction of the first current I1.

Figure 2A:
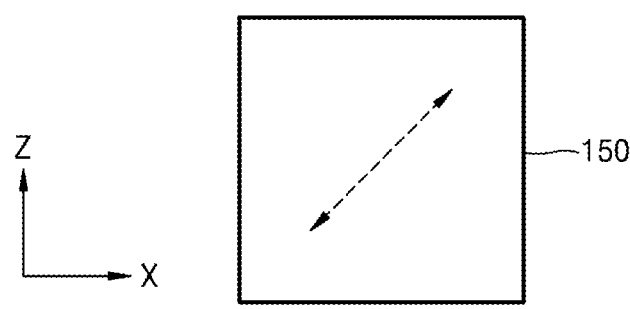
FIGS. 2A and 2B illustrate a magnetization easy axis of a free layer and a magnetization direction of a pinned layer in the magnetic memory device of FIG. 1, respectively.
Figure 2B:
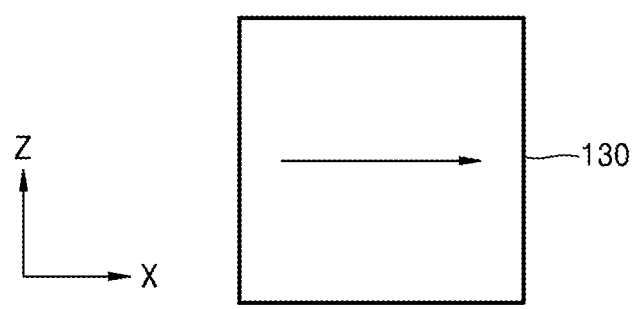

FIGS. 2A and 2B illustrate the direction of an easy axis of the free layer and a direction of the first current I1 flowing along the bit line in the magnetic memory device of FIG. 1, respectively.

The easy axis of the free layer 150 may be tilted at about 45 degrees relative to a magnetization direction of the pinned layer 130. In a toggle switching process using the first and second currents I1 and I2, this is to rotate the magnetization of the free layer 150 stepwise on an in-plane, that is, a plane parallel to an X-Z plane in FIG. 2A.

Figure 3:
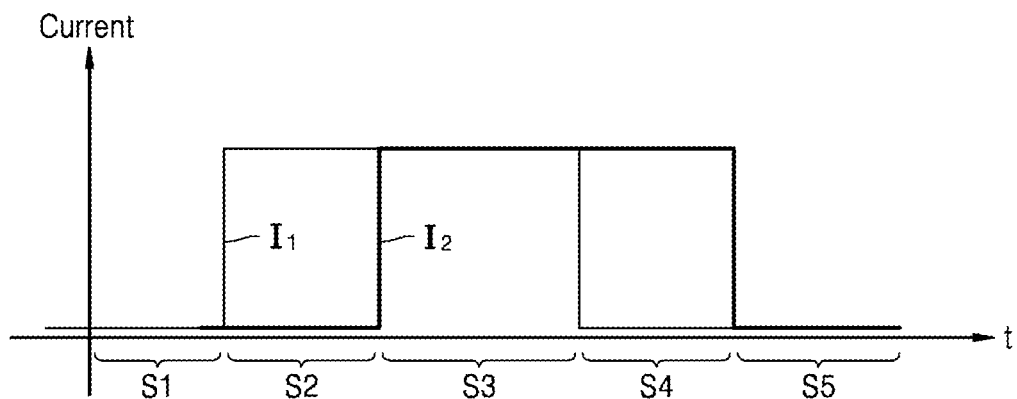

FIG. 3 is a graph illustrating a method of applying current when data is written to the magnetic memory device according to example embodiments. FIGS. 4A through 4E illustrate magnetization directions of the free layer in the respective stages S1 through S5 indicated in FIG. 3.

A method of writing data according to example embodiments include applying a first current I1 which flows in the bit line 190 contacting the free layer 150 along a direction parallel to the free layer 150 and creates a spin current due to a spin Hall effect and applying a second current I2 which creates a spin transfer torque that transfers the magnetization direction of the pinned layer 130 to the free layer 150 and passes through the magnetoresistive cell M. According to the method, the two operations start with time delay therebetween, proceed simultaneously during a predetermined (or, set) time interval, and end with time delay therebetween.

FIG. 3 illustrates an example of application of current in the method.

Figure 4A:
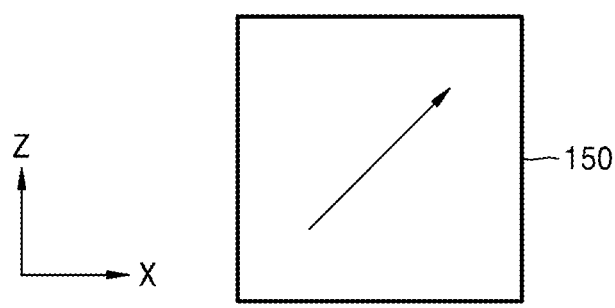
FIGS. 4A through 4E illustrate changes in a magnetization direction of a free layer in respective stages indicated in FIG. 3.

First, stage S1 shows an initial state in which the first current I1 and the second current I2 are not applied, and the magnetization of the free layer 150 at the stage S1 has a form as shown in FIG. 4a.

Figure 4B:
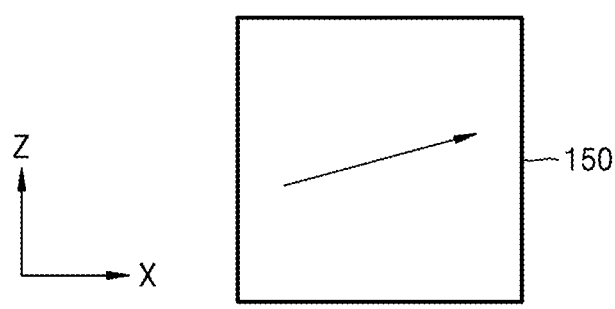

At stage S2, the first current I1 is applied. The magnetization of the free layer 150 is rotated as shown in FIG. 4B due to a spin Hall effect induced by the first current I1.

Figure 4C:
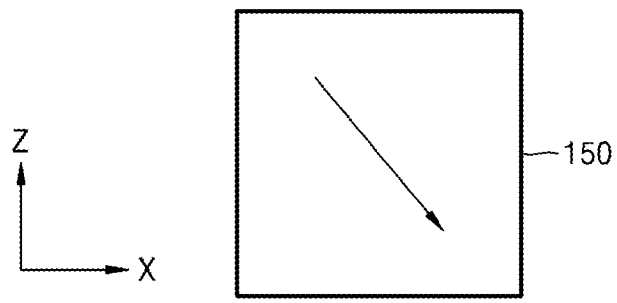

At stage S3, the second current I2 is applied while maintaining the first current I1. The second current I2 is used to transfer the magnetization of the pinned layer 130 to the free layer 150. More specifically, electrons in the second current I2 initially have a random spin distribution and are aligned in the same direction as that of magnetization of the pinned layer 130 as they pass through the pinned layer 130. When the second current I2 with a spin aligned in this way passes through the free layer 150, the magnetization of the free layer 150 receives a torque in a direction such that it rotates in the same direction as a spin state of the second current I2. At this stage S3, the magnetization of the free layer 150 has a form as shown in FIG. 4C by using the spin Hall effect due to the first current I1 in cooperation with the spin transfer torque due to the second current I2.

Figure 4D:
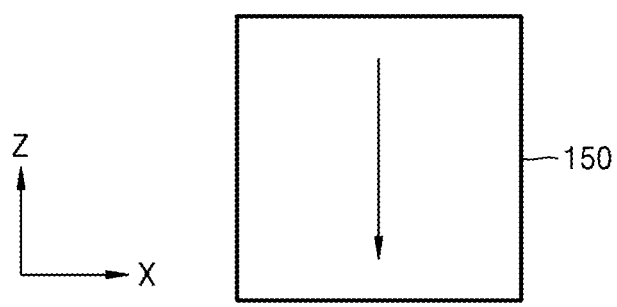

Next, application of the first current I1 ends while maintaining only the second current I2 (S4) and the magnetization of the free layer 150 has a form as shown in FIG. 4D. The first current I1 and the second current I2 are all turned off (S5) so that the magnetization of the free layer 150 is rotated a little bit and has a form as shown in FIG. 4E.

Figure 4E:
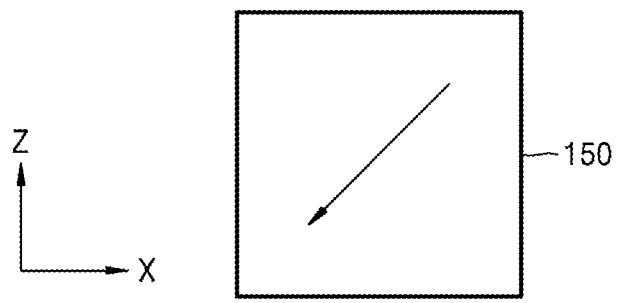

Although the magnetization direction corresponding to each of the stages S1 through S5 rotates from the direction indicated by FIG. 4A towards the direction indicated by FIG. 4E, it is illustrated by way of example only, and the magnetization direction may not exactly correspond to each stage.

To reverse the magnetization of the free layer 150 from the direction indicated by FIG. 4E towards the direction indicated by FIG. 4A, the stages S1 through S4 may proceed in the reverse order. In other words, the stages S1 through S4 may proceed in the order from S4 to S1, so that the magnetization direction of the free layer 150 is rotated from the direction indicated by FIG. 4D toward the direction indicated by FIG. 4A and reversed to have the form as shown in FIG. 4A.

In order to reverse the magnetization direction from the direction indicated by FIG. 4A to the direction indicated by FIG. 4E or vice versa, wherein the direction indicated by FIG. 4A is different by 180 degrees from the direction indicated by FIG. 4E, the first current I1 and the second current I2 may be applied with a time delay therebetween and in reverse order while maintaining a unipolar direction without changing the directions thereof.

The direction of the first current the first current I1 and the second current I2 which remains unchanged during a write operation is illustrated as an example only, and may be changed to opposite directions.

Figure 5:
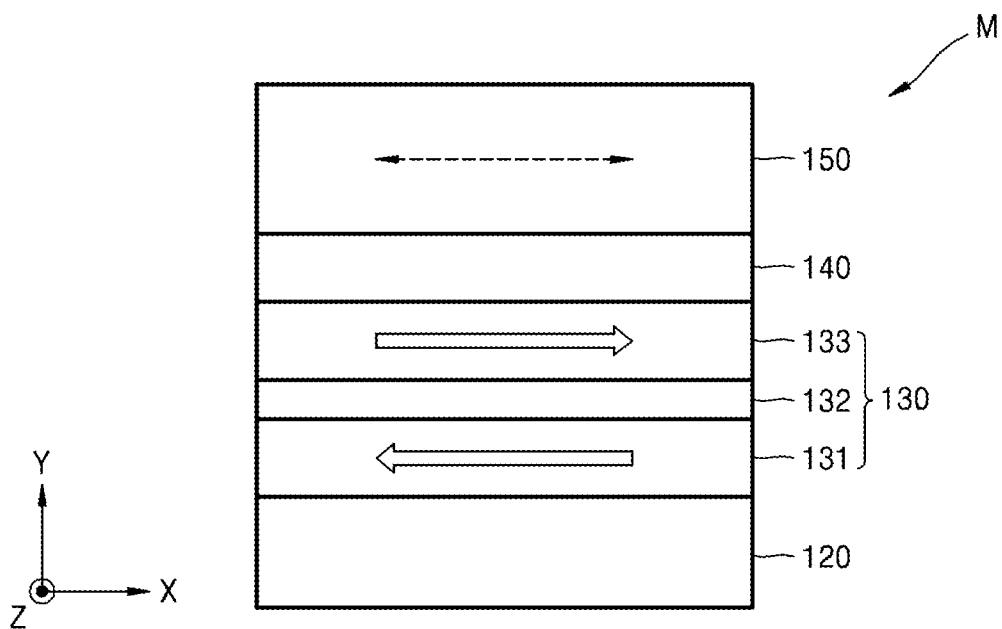

FIG. 5 illustrates an exemplary structure of the magnetoresistive cell M for use in the magnetic memory device of FIG. 1.

Referring to FIG. 5, a magnetoresistive cell M includes a pinning layer 120, a pinned layer 130, a non-magnetic layer 140, and a free layer 150. In the present example embodiments, the pinned layer 130 includes first and second pinned layers 131 and 133 made of a magnetic material and a spacer layer 132 interposed between the first and second pinned layers 131 and 133.

The first and second pinned layers 131 and 133 may be formed of a ferromagnetic material containing at least one of Co, Fe, and Ni, and the spacer layer 132 may be made of a conductive material such as Ru or Cr.

The first pinned layer 131, the spacer layer 132, and the second pinned layer 133 may incorporate a synthetic antiferromagnetic (SAF) structure. In other words, the first pinned layer 131 is exchanged coupled to the second pinned layer 133 so that the first and second pinned layers 131 and 133 have their magnetization fixed in opposite directions. For example, as illustrated in FIG. 5, the first and second pinned layers 131 and 133 may have magnetization fixed in the −X direction and in the +X direction, respectively.

Figure 6:
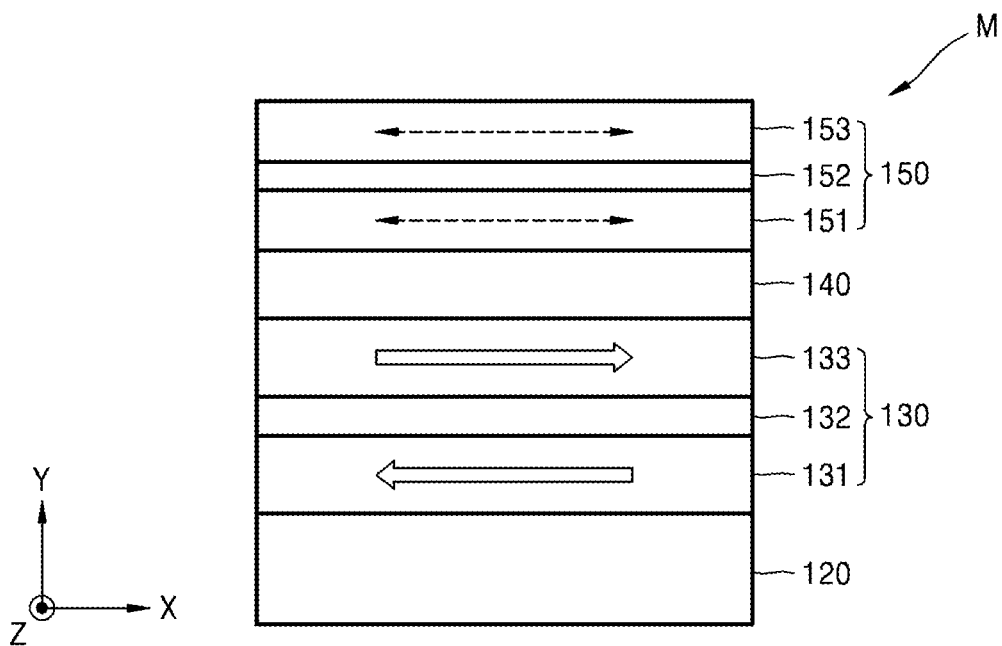

FIG. 6 illustrates another exemplary structure of the magnetoresistive cell M for use in the magnetic memory device of FIG. 1.

Referring to FIG. 6, a magnetoresistive cell M includes a pinning layer 120, a pinned layer 130, a non-magnetic layer 140, and a free layer 150. In the present example embodiment, the pinned layer 130 includes first and second pinned layers 131 and 133 made of a magnetic material and a spacer layer 132 interposed between the first and second pinned layers 131 and 133. The free layer 150 includes first and second free layers 151 and 153 made of a magnetic material, and a spacer layer 152 interposed between the first and second free layers 151 and 153.

The first free layer 151, the spacer layer 152, and the second free layer 153 may incorporate a free-SAF structure. In other words, the first and second free layers 150 may have variable magnetization directions and are antiferromagnetically coupled to each other so that they have magnetization oriented in opposite directions.

Because the free layer 150 in the magnetoresistive cell M in FIGS. 5 and 6 has in-plane magnetic anisotropy, a relation between the direction of an easy axis of the free layer 150 and the direction of the first current I1 flowing along the bit line 190 is the same relation as illustrated in FIGS. 2A and 2B.

Figure 7:
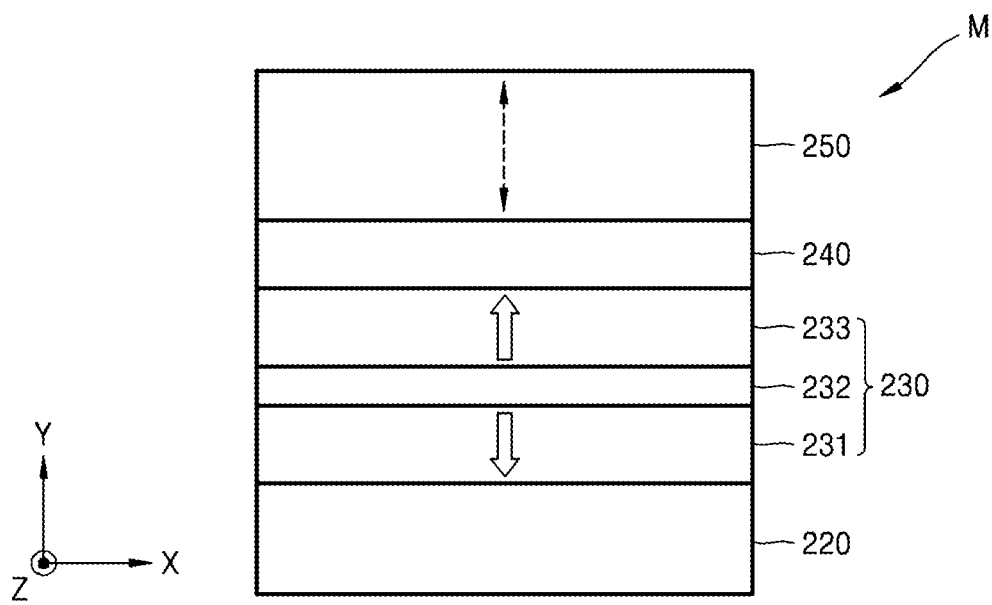

FIG. 7 illustrates another exemplary structure of the magnetoresistive cell M for use in the magnetic memory device of FIG. 1.

Referring to FIG. 7, a magnetoresistive cell M includes a pinning layer 220, a pinned layer 230, a non-magnetic layer 240, and a free layer 250. In the present example embodiments, the pinned layer 230 and the free layer 250 have perpendicular magnetic anisotropy.

The pinned layer 230 includes a first pinned layer 231, a spacer layer 232, and a second pinned layer 233 which may incorporate a SAF structure.

Figure 8:
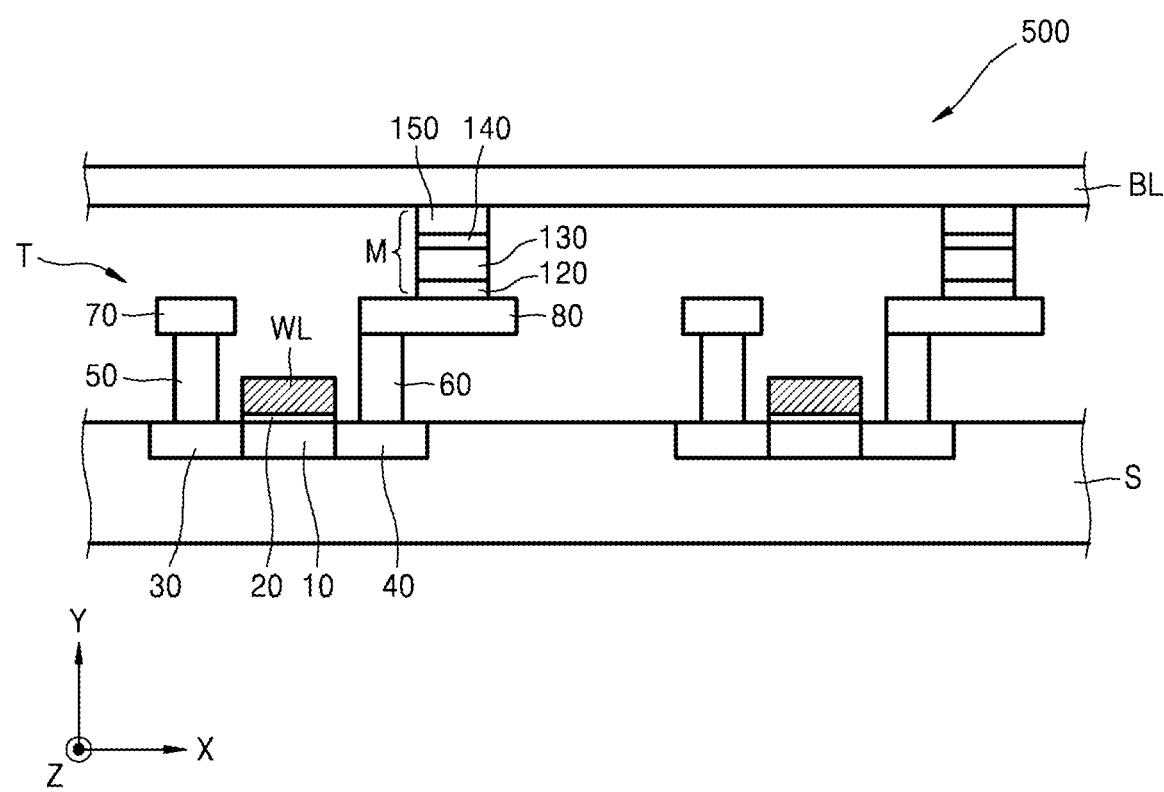

FIG. 8 is a schematic cross-sectional view of a magnetic memory device according to example embodiments.

Referring to FIG. 8, a magnetic memory device 500 according to the present example embodiments include an array of a plurality of magnetoresistive cells M each disposed between a bit line BL and word lines WL, and a switching device for turning on or off the flow of current passing through each magnetoresistive cell M.

The word lines WL may extend lengthwise in the Z direction while being repeatedly separated from each other along the X direction. The bit line BL may extend lengthwise in the X direction while being repeatedly separated from each other along the Z direction. In other example embodiments, more than one of the plurality of magnetoresistive cells M may be electrically connected to a single bit line BL.

The switching device may be a transistor T as illustrated in FIG. 8. The transistor T includes a channel region 10 disposed on a substrate S, a source region 30 and a drain region 40 disposed on either side of the channel region 10, a word line WL disposed above the substrate S and acting as a gate electrode, and a gate insulating layer 20 interposed between the word line WL and the channel region 10.

The source region 30 and the drain region 40 are electrically connected to a source electrode 70 and a drain electrode 80, respectively. As illustrated in FIG. 8, the source region 30 may be connected to the source electrode 50 via a first contact plug 50 while the drain region 40 may be connected to the drain electrode 80 via a second contact plug 60.

The magnetoresistive cell M is disposed between the bit line BL and the drain electrode 80 so that a free layer 150 of the magnetoresistive cell M contacts the bit line BL. The bit line BL may have a dual-layer structure including a spin Hall effect material layer (not shown) and an electrode material layer (not shown) as illustrated in FIG. 1. The spin Hall effect material layer may contact the free layer 150.

Although the magnetoresistive cell M has a structure as shown in FIG. 1, the magnetoresistive cell M may have other various structures as shown in FIGS. 5 through 7.

The transistor T may be connected to the magnetoresistive cell M in different ways. For example, the drain electrode 80 may be disposed directly on the drain region 40 without interposing the second contact plug 60 therebetween. The source region 30 and the drain region 40 in the transistor T may have different functions than those described above. For example, the magnetoresistive cell M may be connected to the source electrode 70.

The magnetic memory devices 100 and 500 according to the example embodiments uses a spin Hall effect to enable toggle switching while having a reduced unit cell size comparable to a STT-MRAM. Thus, the magnetic memory devices may allow a stable write operation on a small-size cell.

Furthermore, in magnetic memory devices and methods of writing data to the magnetic memory devices according to example embodiments, current for inducing a spin Hall effect and current for creating a spin transfer torque are sequentially applied/stopped at predetermined (or, set) time intervals. Thus, the direction of current remains constant regardless of the direction in which magnetization direction is reversed, thereby allowing a stable write operation.

While the magnetic memory devices and methods of writing data to the magnetic memory device according to example embodiments have been particularly shown and described, it will be understood by those of ordinary skill in the art that various changes in form and details may be made therein without departing from the spirit and scope of the disclosure as defined by the following claims. The scope is defined not by the detailed description but by the appended claims, and all differences within the scope of the appended claims and their equivalents will be construed as being included in the disclosure.

What is claimed is:

1. A magnetic memory device, comprising:
a magnetoresistive cell including a free layer having a variable magnetization direction and a pinned layer having a fixed magnetization direction;
a bit line on the magnetoresistive cell, the bit line including a spin Hall effect material layer exhibiting a spin Hall effect and an electrode material layer on the spin Hall effect material layer, the spin Hall effect material layer contacting the free layer, the bit line configured to allow a first current to flow therein;
a lower electrode below the magnetoresistive cell, the lower electrode is configured to allow a second current to pass through the magnetoresistive cell based on a voltage applied between the bit line and the lower electrode; and
a switching device configured to turn on and turn off a flow of the second current passing through the magnetoresistive cell such that a direction of the first current and a direction of the second current remain a same unipolar direction when changing the variable magnetization direction of the free layer.

2. The magnetic memory device of claim 1, wherein, during writing of data,
the bit line is configured to allow the first current to flow along a first direction parallel to the free layer, and
the lower electrode is configured to allow the second current to pass through the magnetoresistive cell based on the applied voltage.

3. The magnetic memory device of claim 2, wherein the free layer has in-plane magnetic anisotropy and has an easy axis tilted at 45 degrees relative to the first direction.

4. The magnetic memory device of claim 2, wherein the first current and the second current are applied at different start times.

5. The magnetic memory device of claim 1, wherein the spin Hall effect material layer includes at least one selected from platinum (Pt), tantalum (Ta), and tungsten (W).

6. The magnetic memory device of claim 5, wherein the spin Hall effect material layer has a thickness greater than a spin diffusion length of a material of the spin Hall effect material layer.

7. The magnetic memory device of claim 1, wherein the electrode material layer is made of a material having a resistivity less than a resistivity of the spin Hall effect material layer.

8. The magnetic memory device of claim 1, wherein the free layer has perpendicular magnetic anisotropy.

9. The magnetic memory device of claim 1, wherein the magnetoresistive cell is a magnetic tunneling junction (MTJ) cell.

10. The magnetic memory device of claim 1, wherein the magnetoresistive cell includes:
a pinning layer made of an antiferromagnetic material;
the pinned layer on the pinning layer;
a non-magnetic layer on the pinned layer; and
the free layer on the non-magnetic layer.

11. The magnetic memory device of claim 10, wherein
the pinned layer includes a first pinned layer, a second pinned layer, and a spacer layer between the first pinned layer and the second pinned layer,
the first pinned layer and the second pinned layer are made of a magnetic material and have the fixed magnetization direction, and
the first pinned layer, the spacer layer, and the second pinned layer collectively form a synthetic antiferromagnetic (SAF) structure.

12. The magnetic memory device of claim 10, wherein
the free layer includes a first free layer, a second free layer, and a spacer layer between the first free layer and the second free layer,
the first free layer and the second free layer are made of a magnetic material and have the variable magnetization direction, and
the first free layer, the spacer layer, and the second free layer collectively form a free-SAF structure.

13. The magnetic memory device of claim 1, wherein the switching device includes a transistor, a source electrode and a drain electrode, the source electrode or the drain electrode of the transistor is the lower electrode.

14. A method of writing data to a magnetic tunneling junction (MTJ) cell including a free layer having a variable magnetization direction and a pinned layer having a fixed magnetization direction, the method comprising:
applying a first current to a bit line contacting the free layer such that the first current flows along a direction parallel to the free layer and creates a spin current due to a spin Hall effect;
applying a second current to the free layer such that the second current creates a spin transfer torque which transfers the fixed magnetization direction of the pinned layer to the free layer, the second current configured to pass through the magnetic tunneling junction (MTJ) cell; and
turning on and turning off a flow of the second current passing through the magnetic tunneling junction (MTJ) cell such that the direction of the first current and a direction of the second current remain a same unipolar direction when changing the variable magnetization direction of the free layer, wherein,
the applying of the first current and the applying of the second current start with a time delay therebetween, proceed simultaneously during a set time interval, and end with the time delay therebetween.

15. The method of claim 14, wherein the variable magnetization direction of the free layer has a first direction and a second direction rotated at 180 degrees from the first direction, the direction of the first current and the direction of the second current remain the same while reversing the variable magnetization direction from the first direction to the second direction and from the second direction to the first direction.

16. The method of claim 15, wherein
the applying of the first current and the applying of the second current when the variable magnetization direction is reversed from the first direction to the second direction proceed with the time delay therebetween, and
the time delay has a reverse order when the variable magnetization direction is reversed from the second direction to the first direction.

17. The method of claim 14, wherein the bit line includes a spin Hall effect material layer exhibiting the spin Hall effect and contacting the free layer.

18. The method of claim 17, wherein
the bit line further includes an electrode material layer on the spin Hall effect material layer, and
the electrode material layer is made of a material having a resistivity less than a resistivity of the spin Hall effect material layer.

19. A method of writing data to a magnetic tunneling junction (MTJ) cell including a free layer and a pinned layer, comprising:
applying a first current to a conductive layer contacting the free layer such that a spin current is created in a direction substantially orthogonal to the first current based on a spin Hall effect induced by a spin Hall effect material in the conductive layer;

applying a second current that passes through the pinned layer to the free layer such that a spin transfer torque is created which transfers a fixed magnetic direction of the pinned layer to the free layer; and turning on and turning off a flow of the second current passing through the magnetic tunneling junction (MTJ) cell such that a direction of the first current and a direction of the second current remain a same unipolar direction when changing a variable magnetization direction of the free layer.

20. The method of claim 19, wherein the applying of the first current and the applying of the second current are started at different times.

21. The method of claim 19, wherein the first current is applied in a direction substantially parallel to the free layer.

22. The method of claim 19, wherein
the free layer and the pinned layer have in-plane magnetic anisotropy, and
the applying of the first current is performed such that an easy axis of the free layer tilts at an angle orthogonal to the direction in which the first current is applied.

23. The method of claim 22, wherein the applying of the second current includes passing the second current through either a synthetic antiferromagnetic (SAF) structure in the pinned layer or a free-SAF structure in the free layer.

24. The method of claim 21, wherein
the free layer and the pinned layer have perpendicular magnetic anisotropy, and
the applying of the first current is performed such that an easy axis of the free layer tilts at an angle orthogonal to the direction in which the first current is applied.

* * * * *